United States Patent
Hartman et al.

(10) Patent No.: US 6,616,794 B2
(45) Date of Patent: *Sep. 9, 2003

(54) INTEGRAL CAPACITANCE FOR PRINTED CIRCUIT BOARD USING DIELECTRIC NANOPOWDERS

(75) Inventors: William F. Hartman, Albuquerque, NM (US); Kirk M. Slenes, Albuquerque, NM (US); Kristen J. Law, Scottsdale, AZ (US)

(73) Assignee: TPL, Inc., Albuquerque (MX)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/305,253

(22) Filed: May 4, 1999

(65) Prior Publication Data

US 2001/0040007 A1 Nov. 15, 2001

Related U.S. Application Data

(60) Provisional application No. 60/084,104, filed on May 4, 1998.

(51) Int. Cl.$^7$ .................. C04B 35/468; H05K 1/16; C09J 5/02
(52) U.S. Cl. .................. 156/306.9; 156/307.3; 501/137; 361/762; 361/763
(58) Field of Search .................. 156/306.9, 307.3; 501/137; 361/762, 763

(56) References Cited

U.S. PATENT DOCUMENTS

| | | |
|---|---|---|
| 3,290,756 A | 12/1966 | Dreyer |
| 3,304,475 A | 2/1967 | Gowen et al. |
| 3,593,107 A | 7/1971 | Chilton et al. |
| 3,673,092 A | 6/1972 | Dietz |
| 4,000,054 A | 12/1976 | Marcantonio |
| 4,087,300 A | 5/1978 | Adler |
| 4,294,009 A | 10/1981 | Quintin et al. |
| 4,306,273 A | 12/1981 | Maylandt et al. |
| 4,490,429 A | 12/1984 | Tosaki et al. |
| 4,520,004 A | 5/1985 | Uedaira et al. |
| 4,558,020 A | 12/1985 | Itakura et al. |
| 4,764,493 A | * 8/1988 | Lilley et al. |
| 4,775,573 A | 10/1988 | Turek |
| 4,816,072 A | 3/1989 | Harley et al. |
| 4,827,377 A | 5/1989 | Butt |
| 4,829,033 A | 5/1989 | Menashi et al. |
| 4,832,939 A | 5/1989 | Menashi et al. |
| 4,859,448 A | 8/1989 | Klee et al. |
| 4,863,883 A | 9/1989 | Menashi et al. |
| 4,882,455 A | 11/1989 | Sato et al. |

(List continued on next page.)

OTHER PUBLICATIONS

Uchino, Kenji, et al, "Particle/Grain Size Dependence of Ferroelectricity", *Ceramic Dielectrics*, 1989, pp. 107–115.

Primary Examiner—Michael W. Ball
Assistant Examiner—John T Haran
(74) Attorney, Agent, or Firm—Deborah A. Peacock; Rod D. Baker; Katy C. Fain

(57) ABSTRACT

A method for producing integral capacitance components for inclusion within printed circuit boards. Hydrothermally prepared nanopowders permit the fabrication of a very thin dielectric layers that offer increased dielectric constants and are readily penetrated by microvias. Disclosed is a method of preparing a slurry or suspension of a hydrothermally prepared nanopowder and solvent. A suitable bonding material, such as a polymer is mixed with the nanopowder slurry, to generate a composite mixture which is formed into a dielectric layer. The dielectric layer may be placed upon a conductive layer prior to curing, or conductive layers may be applied upon a cured dielectric layer, either by lamination or by metallization processes, such as vapor deposition or sputtering.

28 Claims, 4 Drawing Sheets

U.S. PATENT DOCUMENTS

| | | |
|---|---|---|
| 4,908,258 A | 3/1990 | Hernandez |
| 4,942,079 A | 7/1990 | Kumagai et al. |
| 4,943,469 A | 7/1990 | Kumagai et al. |
| 4,943,606 A * | 7/1990 | Inoue et al. ............ 523/457 |
| 4,952,538 A | 8/1990 | Kumagai et al. |
| 4,987,108 A | 1/1991 | Takagi et al. |
| 4,999,740 A | 3/1991 | Ilardi et al. |
| 5,010,641 A | 4/1991 | Sisler |
| 5,112,433 A | 5/1992 | Dawson et al. |
| 5,155,655 A | 10/1992 | Howard et al. |
| 5,161,086 A | 11/1992 | Howard et al. |
| 5,162,977 A * | 11/1992 | Paurus et al. |
| 5,172,304 A * | 12/1992 | Ozawa et al. |
| 5,256,470 A | 10/1993 | Jean et al. |
| 5,261,153 A | 11/1993 | Lucas |
| 5,428,499 A | 6/1995 | Szerlip et al. |
| 5,445,806 A | 8/1995 | Kinugasa et al. |
| 5,451,426 A | 9/1995 | Abe et al. |
| RE35,064 E | 10/1995 | Hernandez |
| 5,469,324 A | 11/1995 | Henderson et al. |
| 5,504,993 A | 4/1996 | Szerlip et al. |
| 5,555,486 A | 9/1996 | Kingon et al. |
| 5,569,488 A | 10/1996 | Frankosky |
| 5,604,018 A | 2/1997 | Horiuchi et al. |
| 5,638,252 A | 6/1997 | Drab et al. |
| 5,796,587 A * | 8/1998 | Lauffer et al. |
| 5,800,575 A | 9/1998 | Lucas |
| 5,870,274 A | 2/1999 | Lucas |
| 5,926,377 A | 7/1999 | Nakao et al. |
| 5,972,231 A | 10/1999 | DiBene, II |
| 5,973,929 A | 10/1999 | Arakawa et al. |

* cited by examiner

INTEGRAL CAPACITANCE FOR PRINTED CIRCUIT BOARD USING DIELECTRIC NANOPOWDERS

CROSS-REFERENCE TO RELATED APPLICATIONS

This application claims the benefit of the filing of U.S. Provisional Patent Application Ser. No. 60/084,104, entitled "Integral Capacitance for Printed Circuit Boards Using Hydrothermal Dielectric Nanopowders," filed on May 4, 1998, and the specification thereof is incorporated herein by reference.

BACKGROUND OF THE INVENTION

1. Field of the Invention (Technical Field)

The present invention relates to providing capacitance in printed circuit boards, more specifically to a method and apparatus for providing a layer or layers of integral capacitance in printed circuit boards using dielectric nanopowders.

2. Background Art

Printed circuit boards (PCBs) typically are constructed in a laminated form. Several layers of laminate are used in a board for providing electrical connections to and among various devices located on the surface of the board. These surface devices consist of integrated circuits and discrete passive devices, such as capacitors, resistors and inductors, and the like. The discrete passive devices occupy a high percentage of the surface area of the complete PCB. Therefore, in order to increase the available surface of the PCBs, there have been a variety of past efforts to locate passive devices, including capacitors, in a embedded, or subsurface, configuration within the board. When passive devices are in such a configuration, they are known collectively and individually in the art as "integral passives." A capacitor designed for disposition within (between the lamina) of a PCB is called an "integral capacitor" and provides "integral capacitance." If integral capacitive devices are to result in significant contributions to the overall power operations in integrated circuits, advances in the energy storage capabilities of these devices must be made.

There have been past attempts to provide integral capacitance. One example of an invention providing for integral capacitance is in U.S. Pat. No. 5,079,069 to Howard, et al., where a dielectric sheet is sandwiched between conducting sheets to provide a layer of integral capacitance. Currently in such configurations the materials consist of conventional PCB laminate resins such as epoxy, and provide a dielectric sheet with a dielectric constant of approximately 4.5. With thicknesses of approximately 2 mils, such material can provide planar capacitance values of approximately 500 picofarads per square inch. However, many applications require capacitance values much greater than 500 picofarads per square inch and therefore other approaches must provide capacitance layers having higher planar capacitance values.

For a fixed capacitor area, only two approaches are available for increasing the planar capacitance (capacitance/area) of an integral capacitor. First, higher dielectric constant materials can be used. Second, the thickness of the dielectric can be reduced. These constraints are reflected in the following formula, known to the art, for capacitance per area:

$$C_p/A = (\varepsilon \varepsilon_0)/t$$

where: $C_p$=capacitance, A=area of capacitor, $\varepsilon$=dielectric constant of laminate, $\varepsilon_0$ = dielectric constant of vacuum, and t=thickness of the dielectric.

Prior efforts in this regard have sought to provide a high capacitance core using laminate a filler having a high dielectric constant. An example, U.S. Pat. No. 5,162,977 suggests how to enhance the capacitance of a dielectric layer using pre-fired and ground ceramic nanopowder, and purports to teach how to produce capacitance values that are four orders of magnitude greater than those achieved simply using epoxy dielectrics. However, using pre-fired and ground ceramic nanopowders in the dielectric layer poses obstacles for the formation of vias (holes permitting electronic communication between layers of a laminated PCB). Pre-fired and ground ceramic nanopowder particles have a typical dimension in the range of 500–20,000 nanometers (nm). Furthermore, the particle distribution in this range is generally rather broad, meaning that there could be a 10,000 nm particle alongside a 500 nm particle. The distribution within the dielectric layer of particles of different size often presents major obstacles to microvia formation, due to the presence of the larger particles. Another problem associated with pre-fired ceramic nanopowders is the ability for the dielectric layer to withstand substantial voltage without breakdown occurring across the layer. Typically, capacitance layers within a PCB are expected to hold off at least 300 V in order to qualify as a reliable component for PCB construction. The presence of the comparatively larger ceramic particles in pre-fired ceramic nanopowders within a capacitance layer prevents ultrathin layers from being used because the boundaries of contiguous large particles provide a path for voltage breakdown. This is doubly unfortunate because, as indicated by the equation above, greater planar capacitance may also be achieved by reducing the thickness of the dielectric layer—with the thinness limited by the size of the particles therein. Accordingly, any process which uniformly disperses very fine uniform dielectric nanopowders within a binder, such as epoxy, leads to capacitance layers which are more compatible with desired microvia formations and can withstand high voltages for thinner layers.

Most commercially available dielectric powders, such as metal titanate-based powders, are produced by a high-temperature, solid-state reaction of a mixture of the appropriate stoichiometric amounts of the oxides or oxide precursors (e.g., carbonates, hydroxides or nitrates) of barium, calcium, titanium, and the like. In such calcination processes, the reactants are wet milled to accomplish an intimate mixture. The resulting slurry is dried and fired at elevated temperatures, as high as 1300° C., to attain the desired solid state reactions. Thereafter, the fired product is milled to produce a powder.

Although the pre-fired and ground dielectric formulations produced by solid phase reactions are acceptable for many electrical applications, they suffer from several disadvantages. First, the milling step serves as a source of contaminants, which can adversely affect electrical properties. Second, the milled product consists of irregularly shaped fractured aggregates which are large in size and possess a wide particle size distribution, 500–20,000 nm. Consequently, films produced using these powders are limited to thicknesses greater than the size of the largest particle. Thirdly, powder suspensions or composites produced using pre-fired ground ceramic powders must be used immediately after dispersion, due to the high sedimentation rates associated with large particles. The stable crystalline phase of barium titanate for particles greater than 200 nm is tetragonal and, at elevated temperatures, a large increase in dielectric constant occurs due to a phase transition.

A need remains for a method and apparatus for providing integral capacitors which employ improved materials to allow for thinner, purer, dielectric layers to boost capacitance and permit reliable creation of microvias.

SUMMARY OF THE INVENTION (DISCLOSURE OF THE INVENTION)

The invention relates to methods and apparatuses for providing integral capacitance within printed circuit boards. According to the invention, there is a method for producing a high capacitance core element for integral inclusion in a printed circuit board comprising the steps of preparing a composite mixture by mixing a bonding matrix material with a slurry comprising a suspension of hydrothermally prepared nanopowder; forming the composite mixture into a dielectric layer; and disposing the dielectric layer between two conductive layers. The method optionally further comprises step of dispersing the hydrothermally prepared nanopowder in an organic solvent. The step of dispersing the hydrothermally prepared nanopowder may comprise dispersing the powder in an initial volumetric ratio of between about 20 percent and about 40 percent powder by volume. The method may also further comprise the step of subjecting the nanopowder and the solvent to ultrasonic energy, or the step of milling the nanopowder and the solvent. Further, a surfactant may be mixed with the nanopowder and solvent.

The step of mixing a bonding matrix material preferably comprises mixing a polymer to form a homogenous nanopowder-polymer-solvent suspension. Also, the invention may further comprise the step of curing the composite mixture to produce a dielectric layer having between about 40 percent and about 55 percent nanopowder by volume.

The step of forming the composite mixture into a dielectric layer preferably comprises impregnating a fiberglass sheet with the composite mixture, and the step of forming the composite mixture into a dielectric layer may comprise selecting a member from the group consisting of extruding, spraying, rolling, dipping, and casting the composite mixture.

The step of disposing a conductive layer preferably comprises laminating a conductive foil onto the cured dielectric layer. Alternatively, the step of disposing a conductive layer comprises the steps of: placing the composite mixture upon a conductive foil, and then curing the dielectric layer. Or, the step of disposing a conductive layer may comprise metallizing the side of the dielectric layer, such as by evaporating, sputtering, or chemical vapor depositing a conductive material upon the dielectric layer.

The objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings.

Figure 1:
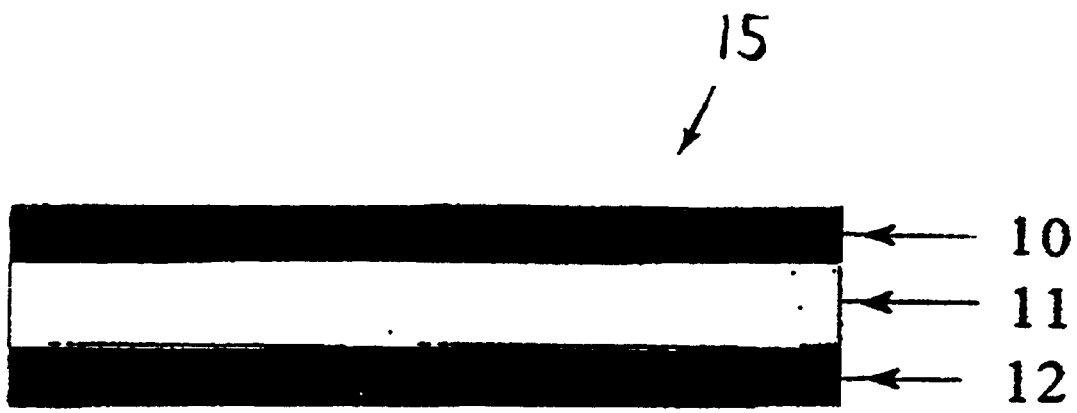
FIG. 1 is a cross sectional view of a integral capacitor apparatus prepared according to the invention.

DESCRIPTION OF THE PREFERRED EMBODIMENTS (BEST MODES FOR CARRYING OUT THE INVENTION)

The present invention relates to a method and apparatus for providing integral capacitance within a printed circuit board (PCB). Highly efficient capacitance can be provided integrally within the PCB through the utility of the invention by permitting the incorporation of one or more ultrathin dielectric layers which resist the undesirable voltage breakdown which besets known integral capacitance devices. Thus, in the present invention, a method is provided for supplying integral capacitance using very fine, uniform dielectric nanopowders within a binder, such that thinner, higher capacitance, layers are obtained. These layers hold off required test voltages, and yet may be successfully penetrated with microvias.

In the present invention, a finer dielectric powder is used, a powder having an unconventionally narrow particle size distribution. The finer powder preferably is produced using a low-temperature chemical precipitation method. The method, known in the art as "a hydrothermal process", has been utilized in manufacturing contexts besides the production of dielectric materials for use in integral capacitors, for example in the production of certain industrial cements. Thus the general hydrothermal process for creating powders is available to one skilled in the art, for example the teachings of U.S. Pat. No. 4,764,493 to Lilley, et al., which are incorporated herein by reference. However, hydrothermally prepared nanopowders have not previously been used to produce composite dielectric layers in the manner disclosed herein, and their use in the invention avoids many of the disadvantages associated with the pre-fired and ground nanopowders commonly employed in the art of capacitor construction.

In the case of barium titanate, for example, titania or a titanium alkoxide is reacted with barium hydroxide solvent to produce a product which possesses high density, high purity, controlled stoichiometry, small particle size and narrow particle size distribution. Reactions are typically performed at temperatures less than 100° C. to produce barium titanate with cubic crystallinity. Reaction conditions can be tailored to produced powders of appropriate compositions, depending on the dielectric application, with a mean primary particle size ranging from 10–200 nm with size deviations less than 20%. Preferably, such hydrothermal process prepared barium titanate powders are employed in the present invention.

Hydrothermally prepared powders offer several advantages, germane to the production of integral capacitors, over conventionally produced powders. First, because composite film thickness is proportional to powder particle size, and the specific capacitance is inversely proportional to film thickness, powder with smaller particle size allows for films to be produced with higher specific capacitance. Second, with the diameter of vias approaching 20,000 nm, producing such vias in composite films incorporating hydrothermally prepared dielectric powders is possible. Third, hydrothermal nanopowders, such as barium titanate powders, possess a cubic structure and thus do not undergo phase transition at the temperatures which produce large increases in dielectric constant for conventionally prepared, pre-fired powders. Lastly, hydrothermal nanopowders are sufficiently small to remain in uniform suspensions or composite slurries without sedimentation, allowing material preparation to occur independently of producing a dielectric layer.

The invention includes alternative processes for producing a high capacitance core element for integral inclusion in a PCB device. A hydrothermally prepared powder, preferably barium titanate powder, with particle size between 10–200 nm preferably is used in all embodiments. In one embodiment, the process of the invention includes forming a dielectric layer consisting of a fiberglass sheet impregnated with a nanopowder-loaded bonding composite, and then sandwiching the dielectric layer between two conductive layers. Alternatively, the nanopowder-loaded composite may be placed onto a conductive substrate, and a top conductive layer formed by coating a conductor, such as by metallization (e.g., through metal evaporation), upon the composite dielectric layer. Or, a dielectric layer comprised of the nanopowder-loaded composite may be formed and then two conductive layers deposited on both sides thereof by metallization, such as through evaporation.

In all embodiments, a slurry is prepared by dispersing the nanopowder, preferably a hydrothermally prepared powder, most preferably a barium titanate nanopowder, in an organic based or aqueous solvent compatible with the bonding material. Suitable solvents for the practice of the invention include methyl ethyl ketone or dimethyl formamide, or a combination of these two. Preferably the slurry is a colloidal suspension, where the powders are prepared to maintain particles apart from each other and to inhibit particle/particle interactions. Powders are mixed into the solvent using sonication, or milling, and coated with surface active molecules (surfactant) in order to minimize powder particle agglomeration. The surfactant preferably but not necessarily is a non-ionic phosphate ester. The polymer matrix material is then added to the colloidal suspension slurry to form a powder-polymer-solvent composite suspension. A polymer epoxy well suited for use as the bonding material in the invention is the 406 Epoxy Resin available from Allied Signal Corporation, although other resins can suffice.

The composite mixtures are then used to create high dielectric constant layers for use as capacitors. In the preferred embodiment of the invention, the solvent/powder slurries have an initial volumetric ratio of between about 20 percent and about 40 percent powder by volume, with higher powder volumes resulting in increased viscosity. Viscosity thus can be controlled to suit the solvent/powder composition for different possible application methods, e.g. casting versus extrusion. The solvent/powder slurry is mixed with the bonding material, and the resulting mixture is cured to drive off solvent and set the matrix. The resulting finished (cured) dielectric layer according to the invention preferably has a volumetric powder/matrix ratio of between about 40 percent and about 55 percent powder by volume. The dielectric constant of a film may be controlled though varying volume fractions of the powder and the bonding material, with higher percent volumes of powder yielding increased dielectric constants at the expense of decreasing mechanical strength. Percent volumes of nanopowders in excess of about 55 percent exhibit undesirable brittleness.

In one embodiment of the invention, a capacitor for integration into a PCB is created by impregnating fiberglass sheets with the composite material and then laminating the impregnated sheet between two conductive layers, such as copper foil. The impregnated fiberglass sheet typically has a thickness ranging between 2.0 mil and 6.0 mil. Preferably, the fiberglass sheet is submerged in and passed through a bath of the composite mixture, and the nanopowder particles are permitted to penetrate into the interstitial spaces of the fiberglass sheet to impregnate it with the composite mixture. An advantage of the invention is that the nano-powders are sufficiently small to freely enter between the glass fibers, thoroughly saturating the fiberglass sheet. This results in a dielectric layer of desirable strength and resiliency which also features suitable dielectric qualities.

Figure 2:
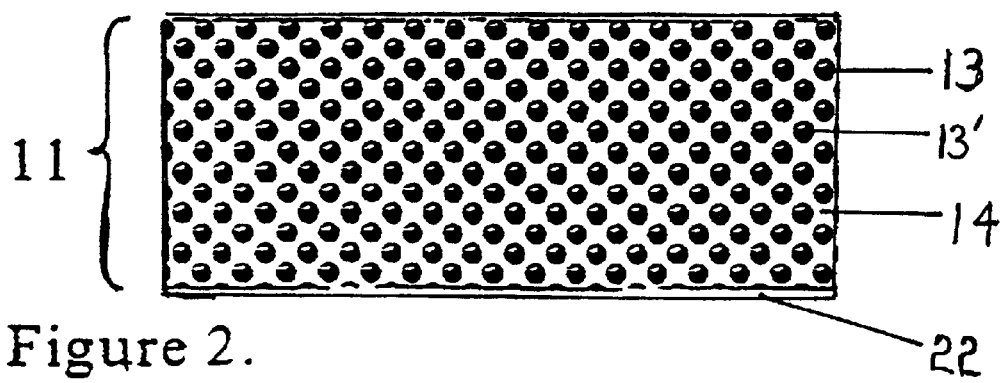
FIG. 2 is an enlarged cross section of the dielectric layer portion of the apparatus shown in FIG. 1, illustrating the dispersal of the nanopowder in the bonding material matrix.
Figure 3:
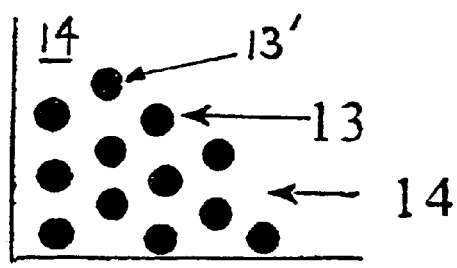
FIG. 3 is a further enlarged view of the components shown in FIG. 2.

The bonding material used in the composite mixture preferably is an epoxy resin, while the ceramic used is a high dielectric constant barium titanate powder produced using a hydrothermal process. Reference is made to FIG. 1, illustrating an integral capacitance apparatus 15 according to the invention. Conductive layers 10 and 12, such as copper foils, have the dielectric layer 11, such as a composite-impregnated fiberglass sheet, disposed there between. FIG. 2 is an enlarged cross sectional view of the composite dielectric layer 11 showing that individual hydrothermally prepared barium titanate nanopowders 13, 13' are uniformly dispersed throughout the bonding matrix 14, which has impregnated the fiberglass sheet 22. FIG. 3 shows an enlarged view of a portion of the dielectric 11, without the fiberglass sheet, where individual hydrothermally prepared nanopowders 13, 13' are disposed within the epoxy matrix 14 at an average distance of separation which permits ready provision of microvias.

In this first embodiment of the invention, the composite-impregnated fiberglass sheet comprises the dielectric layer 11. Subsequent to the production of the dielectric layer 11 as described above, the conductive layers 10 and 12 are disposed upon one, or usually two sides, of the dielectric layer. This may be done in a lamination press, wherein the conductive layers 10, 12 (e.g. thin copper sheets, each about 1 or 2 mils thick) are pressed against the dielectric layer 11, and the entire sandwiched assembly heated to cause the polymer matrix in the dialectic layer 11 to bond to the conductive sheets. Accordingly, in many applications of the invention, it is desirable to employ a polymer with a relatively low glass transition temperature so that conventional lamination presses can induce the bonding between layer 11 and the conduction sheets 10, 12. Besides the foregoing lamination manner of disposing the conductive layers upon the dielectric layer, alternative modes such as attachment of the conductive layers to the dielectric layer using other adhesive materials are within the scope of the invention.

Figure 4:
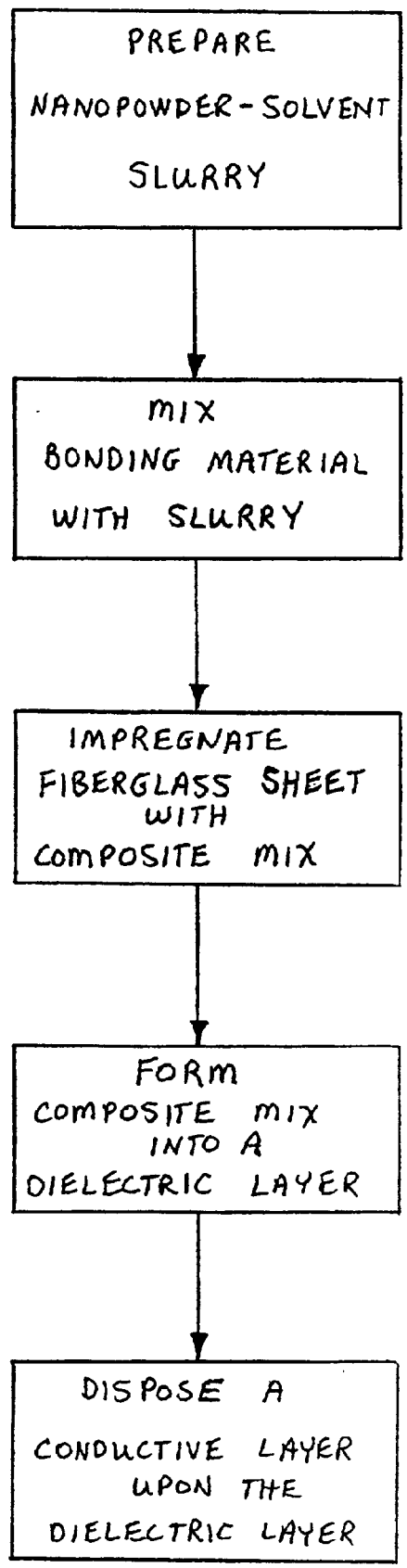
FIG. 4 is a schematic flowchart illustrating some principal steps of one embodiment of the method of the invention.

The method for making the apparatus of this first embodiment is further explained with reference to FIG. 4. Again, in one step, a slurry is prepared by dispersing a hydrothermally prepared nanopowder in a solvent. The dispersal may be accomplished with sonication, or by any other suitable means. Preferably, a surfactant is supplied to the suspension to create a colloidal suspension of the nanopowder in the solvent. Preferably, the bonding material, preferably an epoxy, is mixed with the slurry to prepare a composite mixture of the solvent and nanopowder with the bonding material. The resulting composite mix then is impregnated into a porous supporting laminate, preferably a fiberglass sheet, so that the composite mix and the fiberglass sheet effectively form a dielectric layer. Once the composite has hardened, as by curing, a conductive layer is disposed upon one or preferably both sides of the dielectric layer. Preferably, in this embodiment of the method, the disposition of the conductive layer or layers is accomplished by lamination, in which the three layers are pressed together under conditions of elevated temperature and pressure.

An advantage of the invention is that the use of nanopowders allows microvias to be drilled through the dielectric layer 11 with the use of micro lasers. A typical micro laser beam, encountering a nano-powder particle, is able to destroy or displace the small particle and thereby maintain the straightness and quality of the microvia. In known dielectric layers including conventional powders, the size of the ceramic particles can interfere with microvia drilling with micro lasers. Laser beams are scattered by the larger diameter particles, drilling is impeded, and the quality of the microvia impaired.

In a second embodiment of the invention, an integral capacitor is created by coating a conductive foil or sheet 12 with a composite mixture which includes a bonding matrix material, solvent, and hydrothermally prepared nanopowders. The preparation of the composite mixture is generally the same as previously described, that is, a nanopowder is suspended in a solvent to create a suspension slurry, and the bonding material, usually a polymer, is mixed with the slurry. Coating of a conductive foil substrate 12 such as copper is performed by physical placement of the composite mixture on the foil and subsequent removal of the solvent. For example, the uncured composite mixture may be extruded onto a conductive layer 12, and then the composite and conductive layer placed into a curing oven for about 10 minutes at about 180° F. In this embodiment, no fiberglass sheet is included in the dielectric layer, rather the composite mixture is by itself cured to form the dielectric layer 11. The dielectric layer 11 thus is not as mechanically strong, but, when using powders which have mean diameters of less than 50 nm, dielectric layers as thin as one micron may be obtained. By this embodiment, therefore, integral capacitors yielding extremely high planar capacitance, for example at least 120,000 picofarads per square inch, may be constructed. Application of the uncured composite mixture preferably is accomplished by extruding, or alternatively through spraying, rolling, dipping, or casting the composite mixture onto the conductive substrate 12.

FIG. 1 may also be referred to as illustrative of this second embodiment of the apparatus. The composite dielectric layer 11 forming the dielectric film is placed or coated onto a self-supporting conductive layer 12, such as a copper foil. Subsequently, a second conductive layer 10 is applied to the other side of the dielectric layer 11, such as by press laminating a second foil, or by metal evaporation, to complete the integral capacitor construction. Again, FIG. 2 shows a cross-section of the dielectric composite layer 11, with individual hydrothermally prepared nanopowders 13, 13' uniformly dispersed throughout the binding matrix 14. FIG. 3 shows an enlarged view of the dielectric layer 11 where individual hydrothermally prepared nanopowders 13, 13' are dispersed within the binding matrix 14.

Figure 5:
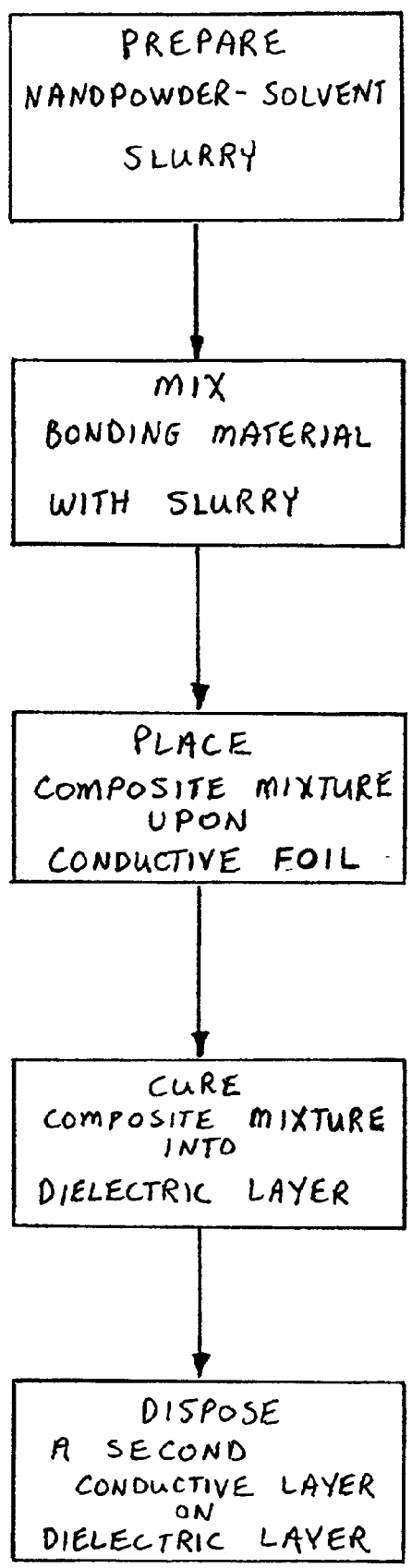
FIG. 5 is a schematic flowchart illustrating some principal steps of another embodiment of the method of the invention.

Reference to FIG. 5 provides additional information regarding the second embodiment of the method of the invention. As mentioned, this embodiment includes the steps of preparing a slurry of a nanopowder dispersed in a solvent, preferably also with a surfactant. The method includes mixing the bonding material, again preferably an epoxy, with the nanopowder-solvent suspension. After the preparation of the composite mixture by mixing the bonding matrix material with the slurry, the forming of the dielectric layer is accomplished by extruding, spraying rolling, dipping or casting the uncured composite mixture, while a conductive layer is disposed thereon by placing the uncured composite mixture upon a self-supporting conductive layer such as a copper foil or the like. The method then involves curing the composite mixture to eliminate most of the solvent, so that the dielectric layer becomes substantially solid. Thereafter, as indicated in FIG. 5, the basic method is completed with the disposing of a second conductive layer, such as a copper foil, on the other side of the dielectric layer, that is, the side of the layer that was not initially placed upon the first conductive layer. This embodiment is characterized, therefore, by the of extruding, spraying, rolling, dipping or casting of the composite mixture directly upon at least one self-supporting conductive layer such as a metal foil. This method permits the forming of extremely thin dielectric layers.

In another embodiment of the invention, a capacitor for integration is created by metallizing a self-supported composite dielectric layer 11 which includes a bonding matrix material and the hydrothermally prepared nanopowders. The composite dielectric layer 11, preferably having a thickness of at least 2.0 micron, is formed by extrusion or casting. The general process of this embodiment of invention is similar to the process of the second embodiment described, except that instead of incorporating at least one self-supporting conductive foil, at least one of the conductive layers 10 and 12 is disposed upon the dielectric layer 11 using a metal deposition process such as evaporation, sputtering or chemical vapor deposition. Thus, the third embodiment includes at least one, "metallized" conductive layer 12, and optionally both layers 10, 12 are metallized layers. An advantage of metallized conductive layers 10 or 12 is that the conductive layers may be deposited with comparatively thin thicknesses, e.g. one micron or less. These thinner conductive layers 10, 12 deposited on the dielectric film 11 using metallization, such as vapor deposition, reduce the amount of etching required for patterning electrodes for specific integral capacitors. Referring again to FIG. 1, the conductive layers 10 and 12 are created by evaporation or sputtering. FIG. 2 shows the cross-section of the dielectric film 11 where individual hydrothermally prepared nanopowders 13, 13' are uniformly dispersed throughout the binding matrix 14.

Figure 6:
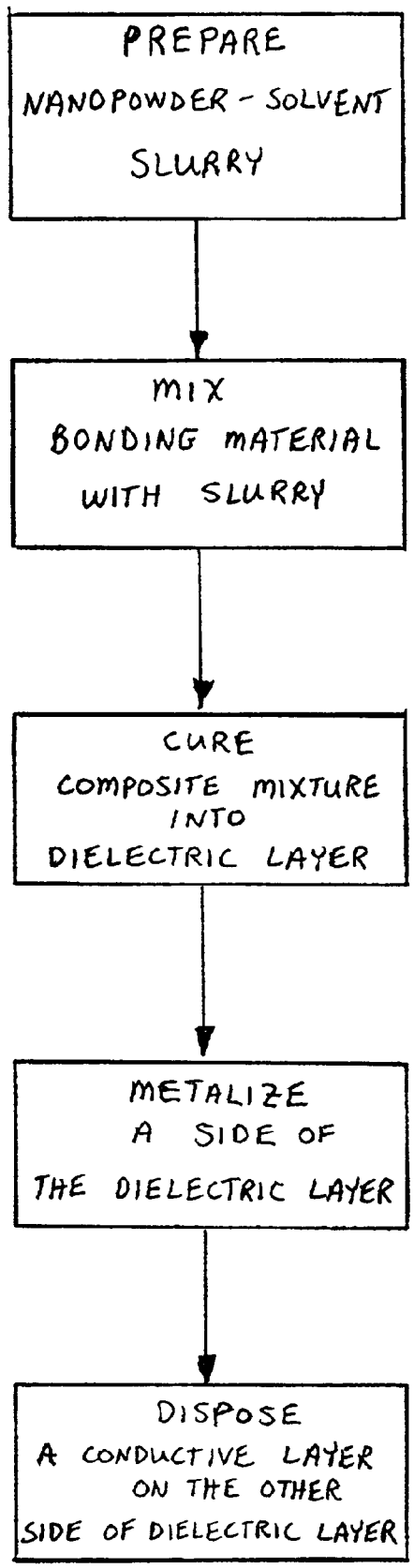
FIG. 6 is a schematic flowchart illustrating some principal steps of yet another embodiment of the method of the invention.

Reference is now made to FIG. 6, which generally depicts the fundamental steps of this third embodiment of the method. Again, the first two basic steps are common to the other embodiments, with the slurry very preferably involving the suspension of a hydrothermally prepared barium titanate nanopowder. The slurry is mixed with the bonding material, and the resulting composite mixture is allowed to cure to form a dielectric layer. In this embodiment, unlike the second embodiment of the method, no self-supporting conductive layers need be disposed against the dielectric layer. Rather, at least one side of the dielectric layer, and optionally both sides of the dielectric layer, are metallized, preferably by metal vapor deposition. This permits the incorporation of extremely thin conductive layers. Finally, as shown by FIG. 6, a second conductive layer is disposed upon the other side of the dielectric layer. This second conductive layer may be a self-supporting metal foil, or, as mention, may be a second metallized surface.

It is seen, therefore, that a single capacitor apparatus according to the invention typically has a composite dielectric layer 11 from about 2 mil to about 6 mil in thickness if the fiberglass sheet is used therein, and with conductive layers 10, 12 each of about 1 to 2 mils thickness, for an overall apparatus thickness of between about 4 mil to about 10 mil. In alternative embodiments constructed without the inclusion of the reinforcing fiberglass sheet, the composite dielectric layer 11 can be much thinner, approaching one mil thickness, while metallized conductive layers 10, 12 produced by vapor deposition or the like can also be much thinner, with corresponding resulting dramatic decreases in the total thickness (e.g. down to about six microns) of the integral capacitor, due particularly to the uniformly small diameters of the nanopowders included in the dielectric layer of the capacitor.

Also, in may applications, it may be desirable to "stack" a number of capacitors, for example from five to ten, produced according to any of the embodiments of the invention, to create a multi-capacitor component. For example, five capacitors (e.g., five dielectric layers alternately stacked between six conductive layers) may be laminated together for inclusion into a PCB.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosure of the corresponding provisional application is hereby incorporated by reference.

We claim:

1. A dielectric material for integral inclusion in a circuit board comprising nanopowders having a cubic crystalline structure prepared using a chemical precipitation process, said nanopowders having a particle size substantially in the range of between 10 and 200 nanometers, and wherein said nanopowders avoid a phase transformation during a temperature change.

2. The dielectric material of claim 1 further comprising a bonding agent wherein a nanopowder/bonding agent ratio is between approximately 30 and 60 percent nanopowder by volume.

3. The dielectric material of claim 1 wherein said nanopowder is barium titanate.

4. The dielectric material of claim 3 wherein said dielectric material has a planar capacitance of at least 100,000 picofarads per square inch.

5. The dielectric material of claim 1 further comprising a polymer resin bonding agent.

6. The dielectric material of claim 5 wherein said polymer resin comprises a polymer epoxy.

7. The dielectric material of claim 1 further comprising a surfactant.

8. The dielectric material of claim 7 wherein said surfactant comprises a non-ionic phosphate ester.

9. The dielectric material of claim 1 wherein said nanopowders are prepared using a low temperature chemical precipitation process.

10. The dielectric material of claim 1 disposed between two conductive layers thereby forming integral embedded capacitance.

11. A method for producing a dielectric film for integral inclusion in a circuit board comprising the steps of:

a) suspending a nanopowder having a particle size substantially in the range of between approximately 10 nanometers and 200 nanometers in a solvent to form a suspension, the nanopowder comprising a cubic crystalline structure prepared using a chemical precipitation process in an organic solvent;

b) preparing a composite mixture by adding a bonding agent to the suspension;

c) forming the composite mixture into a layer;

d) curing the composite mixture layer to form a dielectric film.

12. The method of claim 11 wherein the step of suspending comprises suspending the nanopowder in a member selected from the group consisting of methyl ethyl ketone, dimethyl formamide, and a mixture of methyl ethyl ketone and dimethyl formamide.

13. The method of claim 11 wherein the step of suspending the nanopowder comprises suspending the nanopowder in an initial volumetric ratio of between about 20 percent and about 40 percent powder by volume.

14. The method of claim 11 wherein the step of suspending comprises subjecting to ultrasonic energy the nanopowder in the solvent.

15. The method of claim 11 wherein the step of suspending further comprises adding a surfactant.

16. The method of claim 11 wherein the step of curing the composite mixture layer results in the dielectric film having between about 30 percent and about 60 percent nanopowder by volume.

17. The method of claim 11 wherein the step of forming the composite mixture into a layer comprises impregnating a fiberglass sheet with the composite mixture.

18. The method of claim 11 wherein the step of forming the composite mixture into a layer comprises selecting a process from the group consisting of extruding, spraying, rolling, dipping, and casting the composite mixture.

19. The method of claim 11 further comprising the step of forming a capacitor comprising by disposing the dielectric film between conductive layers.

20. The method of claim 19 wherein the step of disposing the dielectric film between conductive layers comprises laminating conductive foil on surfaces of the dielectric film.

21. The method of claim 19 wherein the step of disposing the dielectric film between conductive layers comprises extruding the composite mixture onto conductive foil prior to curing.

22. The method of claim 19 wherein the step of disposing the dielectric film between conductive layers comprises metallizing surfaces of the dielectric film.

23. The method of claim 22 wherein the step of metallizing comprises at least one process selected from the group consisting of evaporating, sputtering, and chemical vapor depositing of a conductive material.

24. The method of claim 11 wherein the step of using a chemical precipitation process comprises using a low temperature chemical precipitation process.

25. The method of claim 15 wherein the step of adding a surfactant comprises adding a non-ionic phosphate ester.

26. The method of claim 11 wherein the step of providing a bonding agent comprises providing a polymer resin.

27. The method of claim 26 wherein the step of providing a polymer resin comprises providing a polymer epoxy.

28. The method of claim 11 wherein said resulting dielectric material has a planar capacitance of at least 100,000 picofarads per square inch.

* * * * *

UNITED STATES PATENT AND TRADEMARK OFFICE
CERTIFICATE OF CORRECTION

PATENT NO.     : 6,616,794 B2
DATED          : September 9, 2003
INVENTOR(S)    : Hartman et al.

It is certified that error appears in the above-identified patent and that said Letters Patent is hereby corrected as shown below:

<u>Title page,</u>
Item [73], delete "(MX)" and substitute -- (NM) --

Signed and Sealed this

Twenty-seventh Day of January, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,616,794 B2
DATED : September 9, 2003
INVENTOR(S) : William F. Hartman et al.

It is certified that error appears in the above-identified patent and that said Letters Patent is hereby corrected as shown below:

Column 1,
Line 7, after "CROSS-REFERENCE TO RELATED APPLICATION" and before "BACKGROUND OF THE INVENTION" insert the following paragraph:
-- GOVERNMENT RIGHTS
The U.S. Government has a paid-up license in this invention and the right in limited circumstances to require the patent owner to license others on reasonable terms as provided for by the terms of Contract No. DTRA01-99-C-0181 awarded by the Defense Threat Reduction Agency. --

Signed and Sealed this

Twenty-fourth Day of February, 2004

JON W. DUDAS
*Acting Director of the United States Patent and Trademark Office*